United States Patent
Eckert et al.

(10) Patent No.: US 9,679,665 B2
(45) Date of Patent: Jun. 13, 2017

(54) METHOD FOR PERFORMING BUILT-IN SELF-TESTS

(71) Applicant: INTERNATIONAL BUSINESS MACHINES CORPORATION, Armonk, NY (US)

(72) Inventors: Martin Eckert, Boeblingen (DE); Otto A. Torreiter, Boeblingen (DE); Christian Zoellin, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 14/527,352

(22) Filed: Oct. 29, 2014

(65) Prior Publication Data
US 2015/0162097 A1 Jun. 11, 2015

(51) Int. Cl.
*G11C 29/12* (2006.01)
*G01R 31/3187* (2006.01)
(Continued)

(52) U.S. Cl.
CPC .... *G11C 29/12015* (2013.01); *G01R 31/3187* (2013.01); *G06F 11/2236* (2013.01);
(Continued)

(58) Field of Classification Search
CPC ...... G06F 1/3287; G06F 1/3275; G06F 11/27; G06F 11/1068; G06F 11/2236;
(Continued)

(56) References Cited

U.S. PATENT DOCUMENTS

| 4,146,835 | A | * | 3/1979 | Chnapko | G01R 31/31937 324/617 |
| 5,031,177 | A | * | 7/1991 | Jurgen | F02D 41/266 701/114 |

(Continued)

FOREIGN PATENT DOCUMENTS

| GB | 2519752 A | 5/2015 |
| JP | 2003344488 A1 | 12/2003 |
| JP | 2006302470 A1 | 11/2006 |

OTHER PUBLICATIONS

GB Search Report, Reference No. DE920130104, Application No. GB1319034.3, Date of Search Mar. 21, 2014, 4 pages.

*Primary Examiner* — April Y Blair
*Assistant Examiner* — Sazzad Hossain
(74) *Attorney, Agent, or Firm* — L. Jeffrey Kelly (57) ABSTRACT

A method including determining a test duration for testing each of a plurality of memory arrays individually coupled to a plurality of array built-in-self test (ABIST) engines, the test duration is equal to a time period required by each of the plurality of ABIST engines to test each of the plurality of memory arrays, determining a corresponding delay value for each of the plurality of ABIST engines, each of the corresponding delay values is based on the test duration for each of the plurality of memory arrays, and consecutively delaying the start of processing of each of the plurality of ABIST engines by providing each of the corresponding delay values to each of a plurality of programmable delay units individually coupled to each of the plurality of ABIST engines, the start of processing of each of the plurality of ABIST engines is delayed by a different corresponding delay value.

15 Claims, 4 Drawing Sheets

(51) Int. Cl.
*G06F 11/22* (2006.01)
*G06F 11/27* (2006.01)
*G11C 29/26* (2006.01)
G06F 1/32 (2006.01)
G11C 29/32 (2006.01)
G01R 31/28 (2006.01)
G11C 29/50 (2006.01)
G01R 31/30 (2006.01)
G06F 11/10 (2006.01)
G11C 29/04 (2006.01)
G11C 29/36 (2006.01)
G01R 31/317 (2006.01)

(52) U.S. Cl.
CPC .............. *G06F 11/27* (2013.01); *G11C 29/26* (2013.01); *G01R 31/2856* (2013.01); *G01R 31/3004* (2013.01); *G01R 31/31701* (2013.01); *G01R 31/31721* (2013.01); *G06F 1/3275* (2013.01); *G06F 1/3287* (2013.01); *G06F 11/1068* (2013.01); *G11C 29/50* (2013.01); *G11C 2029/0401* (2013.01); *G11C 2029/2602* (2013.01); *G11C 2029/3202* (2013.01); *G11C 2029/3602* (2013.01)

(58) Field of Classification Search
CPC .............. G11C 29/50; G11C 29/12015; G11C 2029/0401; G11C 29/12; G11C 2029/3202; G11C 2029/3602; G11C 2029/2602; G01R 31/3187; G01R 31/2856; G01R 31/3004; G01R 31/31701; G01R 31/31721

USPC .................. 365/201; 714/30, 718, 726, 733, 714/E11.169, E11.177
See application file for complete search history.

(56) References Cited

U.S. PATENT DOCUMENTS

| | | | | |
|---|---|---|---|---|
| 5,685,005 | A | * | 11/1997 | Garde ................ G06F 12/0284 711/153 |
| 5,995,731 | A | | 11/1999 | Crouch et al. |
| 6,255,836 | B1 | | 7/2001 | Schwarz et al. |
| 6,629,280 | B1 | | 9/2003 | Koprowski et al. |
| 7,036,064 | B1 | | 4/2006 | Kebichi et al. |
| 7,100,033 | B2 | * | 8/2006 | Roth .................... G06F 11/2273 709/227 |
| 2003/0021464 | A1 | * | 1/2003 | Takeoka ........... G01R 31/31855 382/145 |
| 2004/0068684 | A1 | * | 4/2004 | Huang ............. G11C 29/56012 714/718 |
| 2004/0093539 | A1 | | 5/2004 | Chadwick et al. |
| 2005/0134300 | A1 | * | 6/2005 | Kushiyama ...... G01R 31/31725 714/733 |
| 2006/0242519 | A1 | * | 10/2006 | Ferguson ......... G01R 31/31854 714/733 |
| 2008/0222471 | A1 | | 9/2008 | Sul et al. |
| 2012/0191400 | A1 | | 7/2012 | Sontakke et al. |
| 2012/0242490 | A1 | * | 9/2012 | Ramaswami ...... G01R 31/3004 340/663 |
| 2013/0219235 | A1 | * | 8/2013 | Ohba .................... G11C 29/12 714/718 |

\* cited by examiner

METHOD FOR PERFORMING BUILT-IN SELF-TESTS

The present invention relates generally to the field of VLSI Chip testing. More specifically, the present invention is related to a method for performing array built-in self-tests and an electronic circuit comprising array built-in self-test engines.

BACKGROUND

Generally, a built-in self-test (BIST) is a mechanism that permits a machine to test a circuitry on its own or independently. Besides other applications, built-in self-tests are used in electronic circuits for testing the functionality of modules or subunits of the electronic circuit or the whole electronic circuit. In other words, the electronic circuit provides a function that verifies all or a portion of the internal functionality of the electronic circuit. The main purpose of BIST is to decrease the test time, reduce the complexity of external test equipment, and thereby decrease the testing costs.

Array built-in self-test (ABIST) is used to test memory arrays that are contained in electronic circuits, e.g. high-end processors. ABIST allows the memory arrays to be tested at a speed identical to or above or below the system clock using a locally generated pattern set that verifies memory array functionality.

By using ABIST many of the test equipment functions are integrated in the electronic circuit under test, eliminating the complex interfacing with external test equipment. One of the major advantages ABIST has over other means of testing memory arrays is that the operation of the test is self-contained. All of the circuitry required to execute the test at-speed is contained within the integrated circuit. Very limited external controls are needed, so ABIST can be run at all levels of packaging (wafer, module and system) without requiring expensive external test equipment.

Due to the rising complexity of memory, ABIST consumes a significant electrical power. When starting the ABIST, there is a sudden large current draw from the electronic circuit power supply leading to fluctuations of the supply voltage. The clock frequency, at which the electronic circuit is driven, depends on the supply voltage. The electronic circuit may run faster with higher voltage and slower with lower voltage.

Hence, there is a need to provide for an improved method for performing ABIST which reduces fluctuations of the electric current and/or fluctuations of electric voltage of an electric circuit.

SUMMARY

It is an objective of embodiments of the invention to provide for a method, computer-readable medium and electronic circuit for reducing fluctuations of the electric current and/or fluctuations of electric voltage during ABIST. The objective is solved by the features of the independent claims. Preferred embodiments are given in the dependent claims. If not explicitly indicated otherwise, embodiments of the invention can be freely combined with each other.

According to a first aspect, a method for performing an array built-in self-test (ABIST) on an electronic circuit is described. The electronic circuit comprise a memory with at least two memory arrays and at least two array built-in self-test engines, where each automatic built-in self-test engine is associated with a different memory array and where each array built-in self-test engine is associated with at least one programmable delay unit. According to the described method at least one delay value is determined. The delay value corresponds to an array built-in self-test (ABIST) engine. The delay value depends on the execution time for testing the memory array associated with the array built-in self-test engine, where in the following the execution time is also referred to as test duration. Preferably, the delay value may be determined based on information indicating the test duration of the memory array with the longest running array built-in self-test engine.

After determining the at least one delay value, the delay value may be provided to the programmable delay unit. The programmable delay unit may be adapted to delay the start of the array built-in self-test engine depending on the respective delay value. Thereby it is possible to delay the starting time of the array built-in self-test engines according to a desired pattern in order to reduce current fluctuations which may cause malfunction of the electronic circuit or parts of the electronic circuit.

According to further embodiments, each array built-in self-test engine is associated with a separate programmable delay unit. Each programmable delay unit may receive a delay value corresponding to the array built-in self-test engine, the delay unit is coupled with. The delay unit may be adapted to monitor the expiry of a time period corresponding to the delay value and provide a start signal to the array built-in self-test engine if the time period corresponding to the delay value has expired.

According to further embodiments, the delay value correlated with a particular memory array is determined based on the test duration of the memory array and the maximum test duration out of all test durations. The test duration of a memory array may depend of the size of the memory array. In order to minimize period of time needed for executing ABIST procedures of all memory arrays, the ABIST engines may run at least partially parallel. The maximum test duration may determine the period of time needed for array built-in self-test of the whole memory. The shorter running ABIST engines may run in parallel to the longest running ABIST engine. In order to ensure that all ABIST engines have terminated their processing when the longest running ABIST engine has terminated, the delay value correlated with a particular memory array may be determined such that the ABIST engine testing the memory array has terminated at least at the same point of time, at which the longest running ABIST engine terminates.

According to further embodiments, the delay value associated with an array built-in self-test engine is determined based on the difference between the maximum test duration and the test duration for testing the memory array associated with the array built-in self-test engine. Thereby, the start of the respective array built-in self-test engines may be delayed such that all array built-in self-test engines stop at the same point of time. By doing so, it is possible to detect technical defects which may not be able to be detected by prior art testing methods. For example, there may be a technical problem which reduces the performance of a certain memory array, e.g. caused due to a clock with a reduced clock frequency. Thereby, also the speed of the ABIST engine is reduced and the ABIST engine may not have terminated testing at the planned point of time at which all ABIST engines should have stopped processing. By monitoring an information indicative for the termination of the ABIST engine processing it may be possible to determine defects leading to a reduced memory array performance.

According to further embodiments, the delay value may be determined such that at least subsets of the array built-in self-test engines start at different points of time. Preferably, all array built-in self-test engines may start at different points of time. Thereby it is possible to reduce the current fluctuations introduced by starting all or a plurality of array built-in self-test engines simultaneously.

According to further embodiments, the delay values are determined such that each array built-in self-test engine stops at the same point of time. Thereby it is possible to monitor if all array built-in self-test engines have terminated testing within the planned period of time and detect slower-running memory arrays.

According to further embodiments, the planned processing termination of each array built-in self-test engine is monitored by a monitoring unit. The monitoring unit may be a common monitoring unit. For example, the monitoring unit may be adapted to monitor if all array built-in self-test engines terminate processing simultaneously, for example the shorter running array built-in self-test engines terminate processing at the same point of time at which the longest running array built-in self-test engine stops processing. Alternatively, the monitoring unit may provide means for receiving time information indicating at which point of time a particular array built-in self-test engine stopped processing. The time information may be compared with reference time information indicating at which point of time the processing should have been terminated. In case, that the received time information corresponds to the reference time information (including tolerable deviations) the monitoring unit may generate a signal indicative for successfully finishing the test. Otherwise a signal indicative for not successfully running the test may be generated. Additionally, the monitoring unit may generate information indicating which memory array did not successfully run the test.

According to a further aspect, an electronic circuit comprising a memory with at least two memory arrays and at least two array built-in self-test engines is described. Each array built-in self-test engine is associated with a different memory array and with a programmable delay unit adapted to control the array built-in self-test engine start. The delay unit may be adapted to monitor the expiry of a time period corresponding to a delay value and provide a start signal to the array built-in self-test engine if the time period corresponding to the delay value has expired.

According to further embodiments, each array built-in self-test engine is associated with a separate programmable delay unit. Preferably, the delay unit may be a counter and the delay value may be a number of clock cycles. The counter may be decreased corresponding to a received clock signal and generate the start signal if the received number of clock cycles has passed.

According to further embodiments, the programmable delay unit is associated with a repository for storing a delay value. The repository may be comprised within the delay unit or may be a separate repository. The delay value may be received from an external control unit, for example contained in external test equipment and adapted to calculate and provide the delay values or may be received from a control unit located in the electronic circuit.

According to further embodiments, the at least one programmable delay unit is adapted to control the array built-in self-test engine start such that at least subsets of the array built-in self-test engines start at different points of time. Preferably, all array built-in self-test engines may start at different points of time. Thereby it is possible to reduce the current fluctuations introduced by starting all or a plurality of array built-in self-test engines simultaneously.

According to further embodiments, the at least one programmable delay unit is adapted to control the array built-in self-test engine start such that each array built-in self-test engine stops at the same point of time. Thereby it is possible to monitor if all array built-in self-test engines have terminated testing within the planned period of time and detect slower-running memory arrays.

According to further embodiments, the at least one programmable delay unit comprises an interface for receiving at least one delay value correlated with an array built-in self-test engine. The interface may be coupled with external test equipment adapted to calculate and provide the at least one delay value. Alternatively, the interface may be coupled with a component of the electronic circuit which is adapted to calculate and provide the at least one delay value.

According to further embodiments, the at least one programmable delay unit is adapted to generate a start signal after expiry of the delay value or a period of time corresponding to the delay value in order to start the array built-in self-test engine correlated with the delay value. The delay value may be an absolute time value which is decreased according to the passed time or a counting value which is decreased based according to the clock cycle.

According to a further aspect, the invention relates to a computer-readable medium comprising computer-readable program code embodied therewith which, when executed by a processor, cause the processor to execute a method as previously described.

BRIEF DESCRIPTION OF THE DRAWINGS

In the following, preferred embodiments of the invention will be described in greater detail by way of example, only making reference to the drawings in which.

DETAILED DESCRIPTION

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described with reference to flowchart illustrations and/or block diagrams of methods, apparatus (systems) and computer program products according to embodiments of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block Diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The block diagrams in the Figures illustrate the architecture, functionality, and operation of possible implementations of systems, methods and computer program products according to various embodiments of the present disclosure. In this regard, each block in the block diagrams may represent a module, segment, or portion of code, which comprises one or more executable instructions for implementing the specified logical function(s). It should also be noted that, in some alternative implementations, the functions discussed hereinabove may occur out of the disclosed order. For example, two functions taught in succession may, in fact, be executed substantially concurrently, or the functions may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Figure 1:
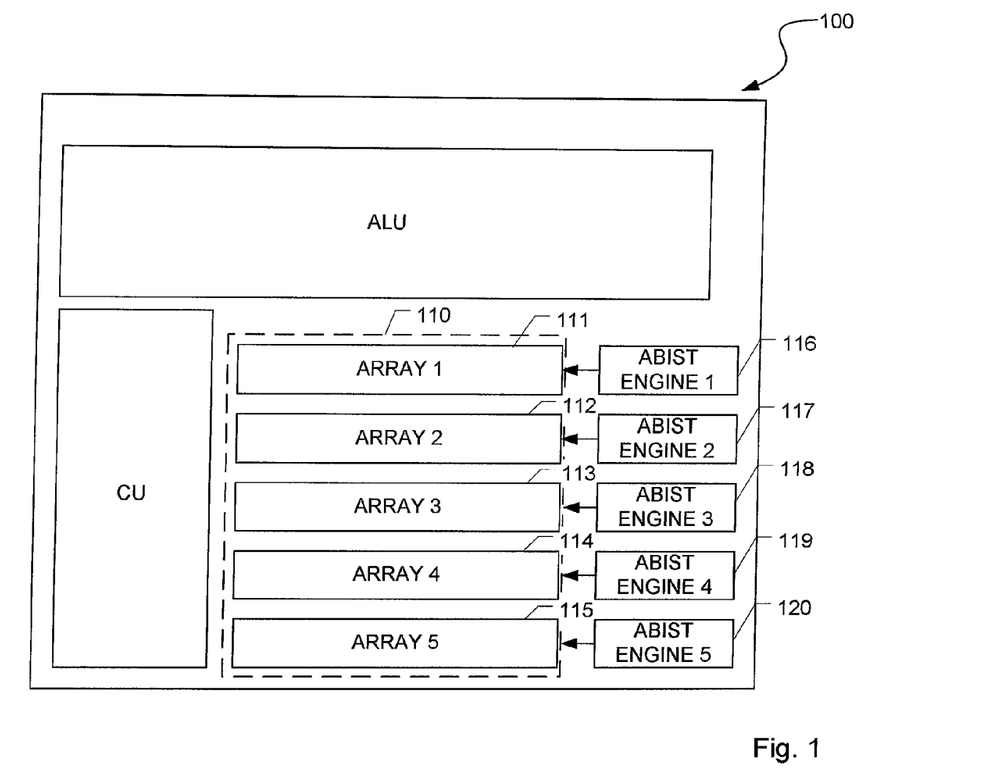
FIG. 1 shows an example schematic representation of an electronic circuit.

Referring to FIG. 1, a schematic diagram of an electronic circuit 100 is shown. The electronic circuit 100 may be an integrated electronic circuit (IC), for example a processor. The electronic circuit 100 may comprise different units, for example, a arithmetic logic unit ALU and a control unit CU and a memory 110. The memory 110 may be subdivided into several memory arrays 111-115. The memory arrays 111-115 may have different sizes, for example the storage provided by the memory arrays 111-115 may be different.

The electronic circuit 100 comprise at least one built-in test component for performing built-in self-tests. Specifically, the integrated circuit 100 comprises a plurality of array built-in self-test (ABIST) engines 116-120. Each ABIST engine 116-120 may be correlated with a certain memory array 111-115. In other words, each ABIST engine 116-120 may be adapted to test a certain memory array 111-115 of the plurality of memory arrays. Each memory array 111-115 may be also built by a set of memory sub-arrays where the set of memory sub-arrays is tested by a single ABIST engine 116-120. Specifically, the ABIST engines 116-120 may be adapted to test the functionality of the associated memory array 111-115, e.g. the memory cells of the memory array, the memory cell addressing etc. For testing the functionality, a certain test pattern may be applied to the memory arrays 111-115 and the results obtained by applying the test pattern to the memory arrays 111-115 may be compared with predefined values for evaluating the test.

Figure 2:
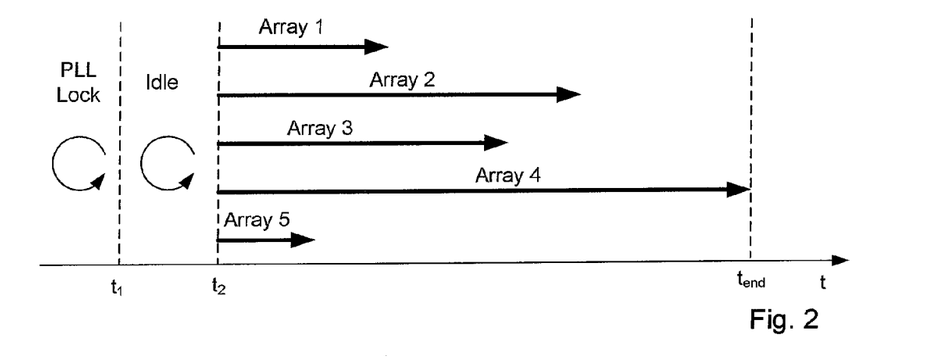
FIG. 2 shows an example schematic flowchart of testing multiple memory arrays according to prior art.

FIG. 2 shows a schematic diagram of performing ABIST according to prior art, where the processing time t is entered on the horizontal axis (x-axis). After starting the test, a first procedure, so-called PLL lock, may be performed. During the first procedure, a stabilized clock may be generated by means of a phase locked loop (PLL). For example, a local oscillator signal having a first oscillation frequency (e.g. 100 MHz) may be transformed into a phase locked, second oscillation frequency (e.g. 1 GHz) for generating a global clock for the electronic circuit 100. Furthermore, it is possible to generate multiple second oscillation frequencies, where each of the second oscillation frequencies may be associated with different components of the electronic circuit 100. For example, the memory arrays 111-115 may be driven with different clock frequencies. After finishing the first procedure, a second procedure (Idle) may be started at t1. During the second procedure, the at least one phase locked clock may be provided to the different modules of the electronic circuit 100 in order to achieve stable operating conditions before starting the ABIST.

After finishing the second procedure, the ABIST may be started at t2. Thereby, all ABIST engines 116-120 start at the same point of time. The test duration for performing the test of a respective memory array 111-116 depends on the size of the memory array 111-116. Typically, the memory arrays 111-116 comprise different sizes. Hence, the memory array with the maximum size defines the point of time, at which all ABIST engines have stopped performing ABIST ($t_{end}$). The ABIST engines correlated with memory arrays having smaller memory sizes may have already finished processing at the point of time.

Figure 3:
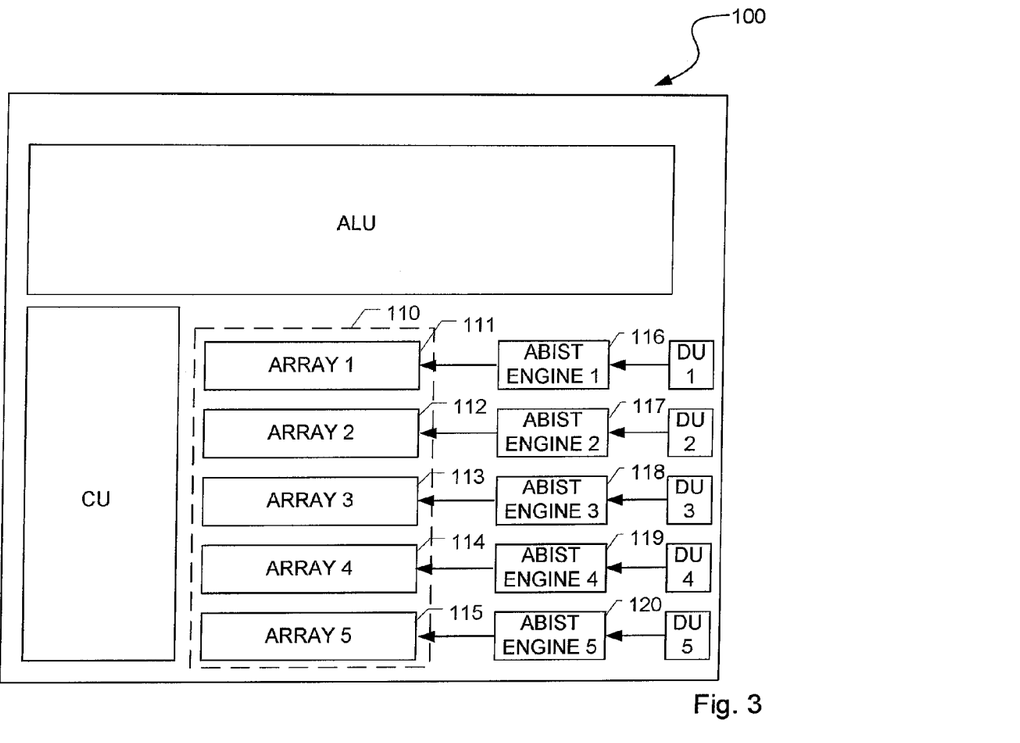
FIG. 3 shows an example schematic representation of an electronic circuit comprising multiple delay units.

FIG. 3 shows a schematic diagram of an electronic circuit 100 according to an embodiment of the invention. The electronic circuit may be an integrated electronic circuit (IC) and may be configured as described above in connection with FIG. 1. Specifically, the electronic circuit 100 comprises different units, for example, an arithmetic logic unit ALU and a control unit CU and a memory 110. The memory 110 may be subdivided into several memory arrays 111-115, where each memory array 111-115 is correlated with an ABIST engine 116-120. Each ABIST engine 116-120 may be correlated or coupled with a separate programmable delay unit DU1-DU5. Alternatively, the ABIST engines 116-120 may be coupled with a common programmable delay unit. The at least one delay unit DU1-DU5 may be adapted to receive a delay value, where the delay value is correlated with certain ABIST engine 116-120 (and thus also with a certain memory array 111-115). The delay value may be provided from an external test environment coupled with the electronic circuit 100 or generated by the electronic circuit 100 itself. The at least one delay unit DU1-DU5 may comprise storage means for storing the at least one delay value or may be coupled with such storage which provides the at least one delay value. For example, the delay unit DU1-DU5 may be realized as a counter and the delay value may be indicative for a number of clock cycles to be waited until the corresponding ABIST engine 116-120 is started. After expiry of the delay value, the delay unit DU1-DU5 may provide a start signal or start trigger to the ABIST engine 116-120 in order to start testing.

The delay values may be determined based on the test duration of the memory array 111-115 the delay value is correlated with. In order to eliminate current fluctuations due to the common start of all ABIST engines 116-120, the delay value correlated to the ABIST engines 116-120, respectively, to the memory arrays 111-115 may be different. In other words, the ABIST engines 116-120 may be started consecutively. In order to obtain minimized over-all test duration (test duration, in which all ABIST engines finished testing), the memory array with the maximum test duration has to be determined and started first. Preferably, the delay value correlated with the memory array comprising the maximum test duration may be set to zero, for example the ABIST of the memory array comprising the maximum test duration starts immediately after finishing the second procedure (idle) (t2) without any delay. The remaining ABIST engines 116-120 which are correlated with memory arrays 111-115 comprising shorter test durations may be delayed such that all or at least subsets of the remaining ABIST engines 116-120 are started at different points of time. Preferably, the ABIST engines 116-120 are started according to a staggered time schedule. Furthermore, the ABIST engines 116-120 correlated with memory arrays 111-115 comprising longer test duration may be started before ABIST engines 116-120 correlated with memory arrays 111-115 comprising shorter test durations.

Figure 4:
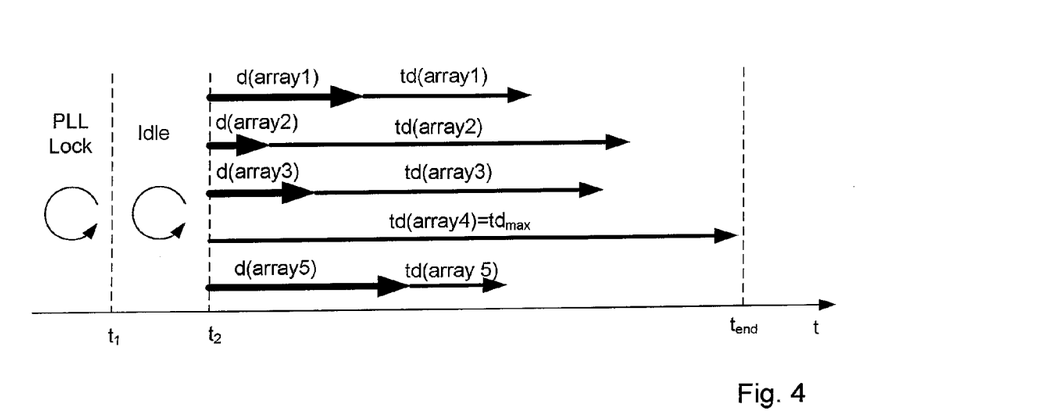
FIG. 4 shows an example schematic flowchart of testing multiple memory arrays according to a first embodiment.

FIG. 4 shows a schematic flow chart of performing ABIST according to a first embodiment. According to the demonstrated example, the electronic circuit 100 comprises five memory arrays to be tested. It is worth mentioning that the electronic circuit 100 is not limited to the number of memory arrays, for example may comprise more or less than five memory arrays. In addition, each memory array may be formed by a set of memory sub-arrays to be tested by a common ABIST engine. As indicated above, after starting the test, a first procedure, so-called PLL lock, may be performed. After finishing the first procedure (point of time t1), a second procedure (Idle) may be performed during which the phase locked clock is provided to the memory arrays 111-115. After finishing the second procedure (point of time t2), the ABIST procedures of the respective memory arrays may be started consecutively.

Preferably, before starting the ABIST procedures, the test durations of all memory arrays are determined. The test duration td, for example the time period required for testing a memory array depends on the memory size of the memory array, for example test duration increases with an increasing memory array size. For example, the test duration $t_d$ for testing a memory array with x word lines and y bit lines may be calculated by the following formula:

$$t_d = x \times y \times n_{instance} \times n_{cycle}$$

where td is the test duration, x is the number of word lines of the memory array, y is the number of bit lines of the memory array, $n_{cycle}$ is the number of cycles to be applied on each memory cell during testing and $n_{instance}$ is the number of instances to be tested. Alternatively, the test durations $t_d$ are not absolute time data (e.g. SI unit μs, ms, s etc.) but relative time data. For example, the test durations $t_d$ may be specified in clock cycles.

The memory array with the longest test duration $td_{max}$ may be started first. In addition, the memory array with the longest test duration tdmax determines all the point of time at which ABIST of the memory arrays should be terminated ($t_{end}$), where $t_{end} = t_2 + td_{max}$. According to the current embodiment, the memory array 4 comprises the longest test duration $td_{max}$ and may be started first. The start of all other ABIST engines (correlated with memory arrays 1-3 and 5) may be delayed according to a determined delay value. The delay value correlated with each memory array may be determined based on the test duration of the respective memory array. For example, the delay value correlated with a memory array with a longer test duration may be smaller than the delay value correlated with a memory array with a shorter test duration. Additionally, the delay value may be chosen such that the sum of the delay value and the test duration is equal or smaller than the maximum test duration ($td_{max}$). According to the example of FIG. 4, the ABIST procedure of memory arrays 1-3 and 5 has been finished well before the ABIST procedure of memory array 4 is terminated. According to the present embodiment, the delay values may be chosen such that the ABIST procedures stop at different points of time in order to avoid current fluctuations due to simultaneous finishing of multiple ABIST engines which has negative effects on still running ABIST engines (e.g. ABIST engine correlated with memory array 4).

Figure 5:
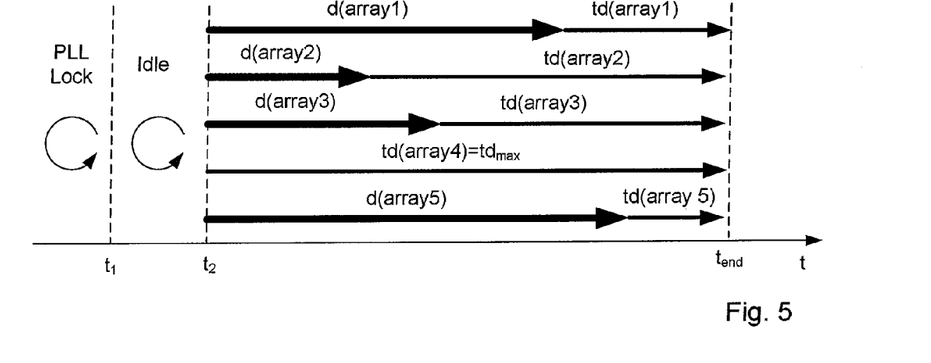
FIG. 5 shows an example schematic flowchart of testing multiple memory arrays according to a second embodiment.

FIG. 5 shows a schematic flow chart of performing ABIST according to a second, preferred embodiment. According to the second embodiment, the delay values for delaying the start ABIST engines are chosen such that all ABIST engines 116-120 stop at the same point of time, namely at the point of time at which the longest running ABIST engine terminates ($t_{end}$). The delay value for delaying the start of an ABIST engine may be calculated based on the longest test duration $td_{max}$ and the test duration of the memory array the ABIST engine is correlated with. Specifically, the delay duration may be calculated based on the following formula:

$$d_n = td_{max} - td_n;$$

where $d_n$ is the delay value correlated to memory array n, $td_{max}$ is the period of time which is needed by the longest running ABIST engine for performing ABIST procedure and $td_n$ is the period of time which is needed for performing ABIST procedure of memory array n, where n is an integer, n[1;N] and N is the number of memory arrays contained within the electronic circuit 100. Alternatively, the delay value $d_n$ may be not absolute time data (e.g. SI unit μs, ms, s etc.) but relative time data. For example, the delay value $d_n$ may be specified in clock cycles.

The main advantage of performing ABIST of the electronic circuit 100 according to the second embodiment is that all ABIST engines should terminate processing at a certain point of time. Thereby it is possible to detect technical problems which lead to a longer test duration, e.g. caused by a lower clock frequency applied to a memory array. In other words, memory arrays which show slower processing speed compared to their typical processing speed can be detected.

Preferably, the ABIST engines 116-120 are adapted to generate information which is indicative for the termination of the ABIST procedure performed by the respective ABIST engine 116-120. For example, the information may be a flag which is generated by the respective ABIST engine 116-120 after terminating the ABIST procedure. The information may be stored in a repository and may be read out at the point of time or after the point of time, at which all ABIST engines should have terminated their processing. So if all memory arrays are working correctly, all ABIST engines 116-120 should have terminated their processing and therefore should have generated information indicating the completion of the ABIST procedure. In case that no information indicating the completion of the ABIST procedure is stored within the repository, the ABIST engine or the corresponding memory array may be defect, for example the electronic circuit is not working properly. Preferably, an error message may be generated comprising information regarding the detected defect and the affected memory array. The error detection based on the stored information may be performed by an evaluation unit contained within the electronic circuit 100 or an evaluation unit of external test equipment.

Figure 6:
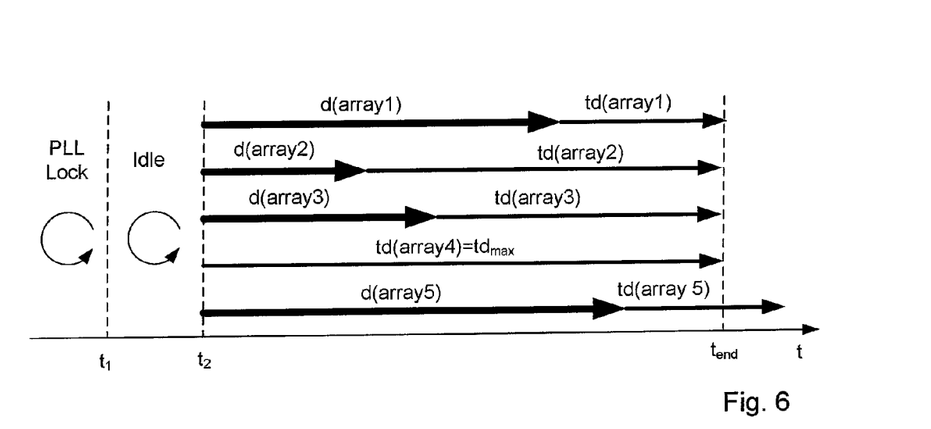
FIG. 6 shows an example schematic flowchart of testing an electronic circuit according to FIG. 5 comprising a defect memory array.

FIG. 6 shows the schematic flow chart of performing ABIST according to a second embodiment where the ABIST engine 120 testing the memory array 5 is run with a clock rate lower than expected leading to a longer test execution time. Thereby, at the point of time $t_{end}$, the ABIST engine 120 corresponding to memory array 5 has not terminated the processing and no information indicating the termination of processing may be generated. When evaluating the information by the evaluation unit, the evaluation unit may recognize that ABIST engine 120 did not terminate processing. Thereby, an error message indicating a technical defect of the tested electronic circuit may be generated which may not be detected in a test scenario according to FIG. 2 or 4. The slower running ABIST engine 120 may hide array failures which do not appear at lower clock speed but at nominal clock frequency or test scenarios testing the memory array above nominal clock frequency.

Figure 7:
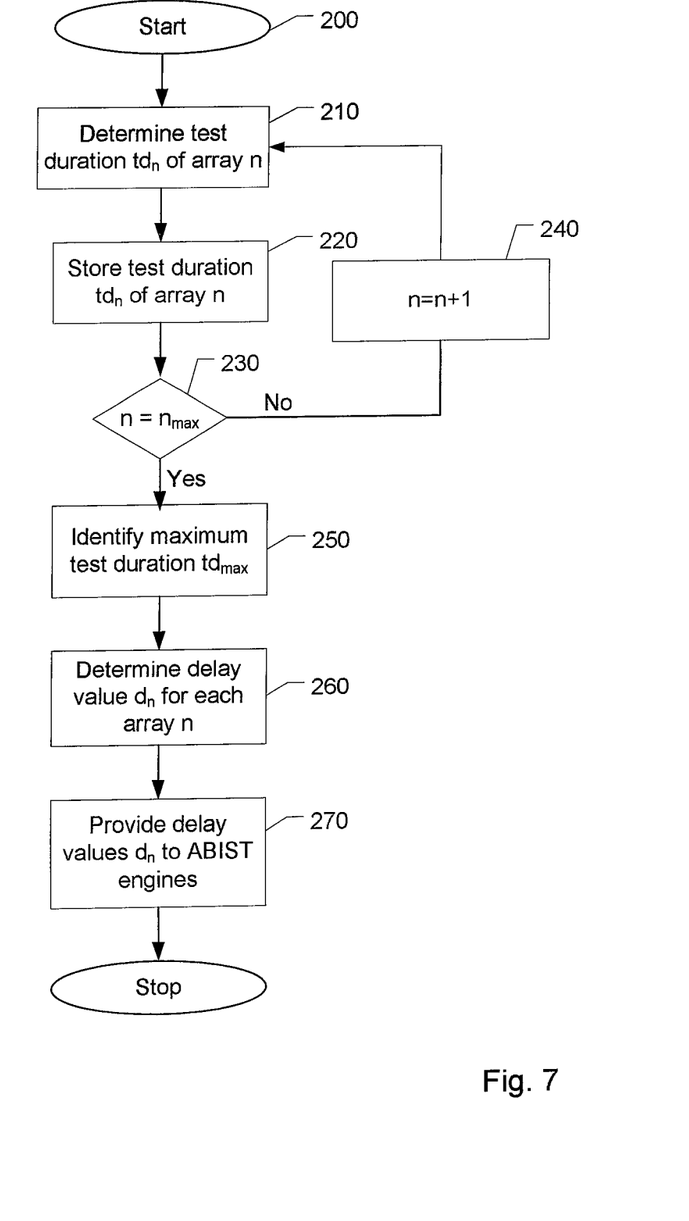
FIG. 7 shows a schematic flowchart for determining the delay values correlated with the memory arrays.

FIG. 7 shows a schematic flow chart of a method for generating delay values corresponding to the ABIST engines 116-120. After starting the delay value generation method (step 200), the test duration $td_n$ of memory array n, for example the period of time necessary for testing memory array n may be determined (step 210), where n is an integer characterizing the respective memory array. The test duration $td_n$ may be calculated based on information regarding the memory size of the memory array n as indicated above. The calculated test duration $td_n$ of memory array n may be stored in a repository (step 220), for example, in a data base.

After storing the calculated test duration value $td_n$, there may be a check if n equals $n_{max}$, for example the maximum number of memory arrays contained within the electronic circuit 100 is reached. If not, for example $n < n_{max}$, n is incremented (n=n+1) (step 240). Following up, the test duration $td_{n}+1$ of memory array n+1 is calculated and stored. In other words, steps 210-240 form a loop for determining and storing the periods of time needed for testing the respective memory arrays by their ABIST engines.

If check step 230 indicates that the test durations for all memory arrays are determined and stored, the maximum test duration $td_{max}$ of all test durations may be identified (step 250). In other words, the maximum test duration $td_{max}$ may be indicative for the longest period of time necessary for testing a memory array. Based on the maximum test duration $td_{max}$ the delay value $d_n$ for delaying the start of ABIST procedure of each memory array n is determined (step 260). For example, the delay value $d_n$ may be calculated based on the maximum test duration $td_{max}$ and the test duration value $td_n$ where n is an integer characterizing the respective memory array. Preferably, the delay value $d_n$ may be calculated based on the following formula:

$$d_n = td_{max} - td_n$$

After determining the delay values $d_n$, the delay values $d_n$ may be provided to the at least one delay unit (step 270). Specifically, the delay value may be stored within the at least one delay unit. After starting ABIST at $t_2$, the start of the ABIST engines 116-120 may be delayed according to the respective delay values $d_n$. The delay value correlated with the memory array with the longest test duration $td_{max}$ may be zero, for example the start of the ABIST engine correlated with the memory array may not be delayed.

The invention claimed is:

1. A method for testing a memory, comprising:
   determining a test duration for testing each of a plurality of memory arrays coupled to a corresponding plurality of array built-in-self test (ABIST) engines such that only one memory array is coupled to only one ABIST engine, the test duration is equal to a time period required by each of the plurality of ABIST engines to test each of the plurality of memory arrays and is based on a respective size of each of the memory arrays;
   determining a corresponding delay value for each of the plurality of ABIST engines, wherein each of the corresponding delay values is based on the test duration for each of the plurality of memory arrays; and
   consecutively delaying the start of processing of each of the plurality of ABIST engines providing each of the corresponding delay values to each of a corresponding plurality of programmable delay units coupled to each of the plurality of ABIST engines such that only one delay unit is coupled to only one ABIST engine, wherein the start of processing of each of the plurality of ABIST engines is delayed by a different corresponding delay value such that processing for one of the plurality of ABIST engines coupled to one of the plurality of memory arrays having a longer test duration is started before processing for another one of the plurality of ABIST engines coupled to another one of the plurality of memory arrays having a shorter test duration.

2. The method according to claim 1, wherein the test duration and the corresponding delay values are specified in clock cycles.

3. The method according to claim 1, wherein each of the plurality of ABIST engines performs an array built-in self-test for only the memory array to which it is coupled.

4. The method according to claim 1, wherein the test duration is based on a number of word lines, a number of bit lines, and a number of cycles applied to each memory array during testing.

5. The method according to claim 1, further comprising:
   generating, by a respective ABIST engine, a flag indicating completion of processing by the respective ABIST engine.

6. A method for testing a memory, comprising:
   determining a test duration for testing each of a plurality of memory arrays coupled to a corresponding plurality of array built-in-self test (ABIST) engines such that only one memory array is coupled to only one ABIST engine, the test duration is equal to a time period required by each of the plurality of ABIST engines to test each of the plurality of memory arrays and is based on a respective size of each of the memory arrays;
   determining a corresponding delay value for each of the plurality of ABIST engines, each of the corresponding delay values is based on the test duration for each of the plurality of memory arrays;
   consecutively delaying the start of processing of each of the plurality of ABIST engines by providing each of the corresponding delay values to each of a corresponding plurality of programmable delay units coupled to each of the plurality of ABIST engines such that only one delay unit is coupled to only one ABIST engine, wherein the start of processing of each of the plurality of ABIST engines is delayed by a different corresponding delay value such that processing for one of the plurality of ABIST engines coupled to one of the plurality of memory arrays having a longer test duration is started before processing for another one of the plurality of ABIST engines coupled to another one of the plurality of memory arrays having a shorter test duration; and
   setting the corresponding delay value to zero for one of the plurality of ABIST engines coupled to one of the plurality of memory arrays having a maximum test duration.

7. The method according to claim 6, wherein the test duration and the corresponding delay values are specified in clock cycles.

8. The method according to claim 6, wherein each of the plurality of ABIST engines performs an array built-in self-test for only the memory array to which it is coupled.

9. The method according to claim 6, wherein the test duration is based on a number of word lines, a number of bit lines, and a number of cycles applied to each memory array during testing.

10. The method according to claim 6, further comprising:
    generating, by a respective ABIST engine, a flag indicating completion of processing by the respective ABIST engine.

11. A method for testing a memory, comprising:
    determining a test duration for testing each of a plurality of memory arrays coupled to a corresponding plurality of array built-in-self test (ABIST) engines such that only one memory array is coupled to only one ABIST engine, the test duration is equal to a time period required by each of the plurality of ABIST engines to test each of the plurality of memory arrays and is based on a respective size of each of the memory arrays;
    determining a corresponding delay value for each of the plurality of ABIST engines, each of the corresponding delay values is based on the test duration for each of the plurality of memory arrays;
    consecutively delaying the start of processing of each of the plurality of ABIST engines by providing each of the corresponding delay values to each of a corresponding plurality of programmable delay units coupled to each of the plurality of ABIST engines such that only one delay unit is coupled to only one ABIST engine, wherein the start of processing of each of the plurality of ABIST engines is delayed by a different corresponding delay value such that processing for one of the plurality of ABIST engines coupled to one of the plurality of memory arrays having a longer test duration is started before processing for another one of the plurality of ABIST engines coupled to another one of the plurality of memory arrays having a shorter test duration; and setting the corresponding delay value to zero for one of the plurality of ABIST engines coupled to one of the plurality of memory arrays having a maximum test duration, the corresponding delay value for each of the plurality of ABIST engines coupled to one of the plurality of memory arrays having a test duration less than the maximum test duration is equal to the maximum test duration minus the test duration for each of the plurality of memory arrays, respectively.

12. The method according to claim 11, wherein the test duration and the corresponding delay values are specified in clock cycles.

13. The method according to claim 11, wherein each of the plurality of ABIST engines performs an array built-in self-test for only the memory array to which it is coupled.

14. The method according to claim 11, wherein the test duration is based on a number of word lines, a number of bit lines, and a number of cycles applied to each memory array during testing.

15. The method according to claim 11, further comprising:

generating, by a respective ABIST engine, a flag indicating completion of processing by the respective ABIST engine.

* * * * *